(12) United States Patent
Shiina et al.

(10) Patent No.: US 11,676,789 B2
(45) Date of Patent: Jun. 13, 2023

(54) SEMICONDUCTOR DEVICE

(71) Applicant: ABLIC Inc., Tokyo (JP)

(72) Inventors: Yoshiomi Shiina, Tokyo (JP); Kenji Yoshida, Tokyo (JP)

(73) Assignee: ABLIC Inc., Tokyo (JP)

(*) Notice: Subject to any disclaimer, the term of this patent is extended or adjusted under 35 U.S.C. 154(b) by 111 days.

(21) Appl. No.: 17/211,538

(22) Filed: Mar. 24, 2021

(65) Prior Publication Data
US 2021/0304997 A1 Sep. 30, 2021

(30) Foreign Application Priority Data

Mar. 30, 2020 (JP) ............................. JP2020-061155

(51) Int. Cl.
*H01H 85/02* (2006.01)
*H03K 3/037* (2006.01)
*G01R 31/74* (2020.01)
*H03K 19/20* (2006.01)

(52) U.S. Cl.
CPC ......... *H01H 85/0241* (2013.01); *G01R 31/74* (2020.01); *H03K 3/037* (2013.01); *H03K 19/20* (2013.01); *H01H 2085/0283* (2013.01)

(58) Field of Classification Search
CPC ....... H01H 85/0241; H01H 2085/0283; H01H 9/167; H01H 85/30; G01R 31/74; G01R 31/54; G01R 31/52; H03K 3/037; H03K 19/20; H03K 19/003
See application file for complete search history.

(56) References Cited

U.S. PATENT DOCUMENTS

| 6,169,393 B1* | 1/2001 | Hashimoto | ............ | G11C 17/18 |
| | | | | 323/354 |
| 10,283,303 B2* | 5/2019 | Ariyama | ............ | H01H 85/0241 |

FOREIGN PATENT DOCUMENTS

JP 2006-344793 A 12/2006

\* cited by examiner

*Primary Examiner* — John W Poos
*Assistant Examiner* — Tyler J Pereny
(74) *Attorney, Agent, or Firm* — Crowell & Moring LLP

(57) ABSTRACT

Provided is a semiconductor device capable of detecting an abnormal state in which two fuses are both short-circuited or cut. The semiconductor device includes: a trimming circuit having a first fuse and a second fuse connected in series; a current source circuit configured to supply current to the trimming circuit; and a determination circuit configured to determine whether a connection state or disconnect state of the first fuse and the second fuse are abnormal or not based upon signals derived from an output signal of the trimming circuit.

6 Claims, 2 Drawing Sheets

SEMICONDUCTOR DEVICE

RELATED APPLICATIONS

This application claims priority to Japanese Patent Application No. 2020-061155, filed on Mar. 30, 2020, the entire content of which is incorporated herein by reference.

BACKGROUND OF THE INVENTION

1. Field of the Invention

The present invention relates to a semiconductor device.

2. Description of the Related Art

A semiconductor device includes a circuit for realizing a specific function (hereinafter, referred to as "functional circuit"). The functional circuit may be constructed to have a trimming circuit including, in a path, Zener diodes, fuses, or the like that can be subsequently short-circuited or cut, for example, from the perspective of making the circuit of which characteristics such as a voltage value and a current value are changeable (for example, Japanese Patent Application Laid-Open No. 2006-344793).

The above-described trimming circuit includes two fuses connected in series between a power supply and the ground. The trimming circuit further includes a resistor element having one end connected to the power supply and the other end connected to a fuse on the power supply side between the two fuses connected in series with the power supply. In the semiconductor device having the trimming circuit, the circuit characteristics can be changed by cutting one fuse of the two fuses included in the trimming circuit and leaving (not cutting) the other fuse.

SUMMARY OF THE INVENTION

However, in the conventional semiconductor device described above, it may be difficult to detect whether the two fuses connected in series to switch the circuit characteristics are cut in the correct state or not after the event. Specifically, there are cases where both of the two fuses are cut accidentally and where both of the two fuses are left without cutting a fuse to be cut. Hereinafter, a state where the two fuses are not both cut or are both cut is referred to as an "abnormal cut state."

In the case where the two fuses are both cut accidentally, the potential at a terminal connected to the trimming circuit floats. This makes it difficult to detect whether the two fuses are in a correct cut state or the abnormal cut state.

Further, in a case where the correct cut state is such a state that one fuse on the power supply side is cut and the other fuse on the ground side is left, voltage at the connection point of the two fuses becomes the ground voltage as long as the two fuses are cut correctly. However, even if the two fuses are both left accidentally, the voltage at the connection point of the two fuses becomes the ground voltage. In the case where the fuse on the power supply side is cut and the fuse on the ground side is left, a difference between the correct cut state and the wrong cut state where the two fuses are both left cannot be detected.

The present invention has been made in view of the above-described circumstances, and it is an object thereof to provide a semiconductor device capable of detecting such an abnormal cut state that two fuses connected in series are both short-circuited or cut.

A semiconductor device according to one aspect of the present invention includes: a trimming circuit including a first fuse and a second fuse connected in series; a current source circuit configured to supply current to the trimming circuit; and a determination circuit configured to determine whether a connection state or disconnect state of the first fuse and the second fuse are abnormal or not based upon signals derived from an output signal of the trimming circuit.

According to the semiconductor device, such an abnormal cut state that two fuses connected in series are short-circuited or cut can be detected.

DETAILED DESCRIPTION OF THE PREFERRED EMBODIMENTS

Semiconductor devices according to embodiments of the present invention will be described below with reference to the accompanying drawings.

First Embodiment

Figure 1:
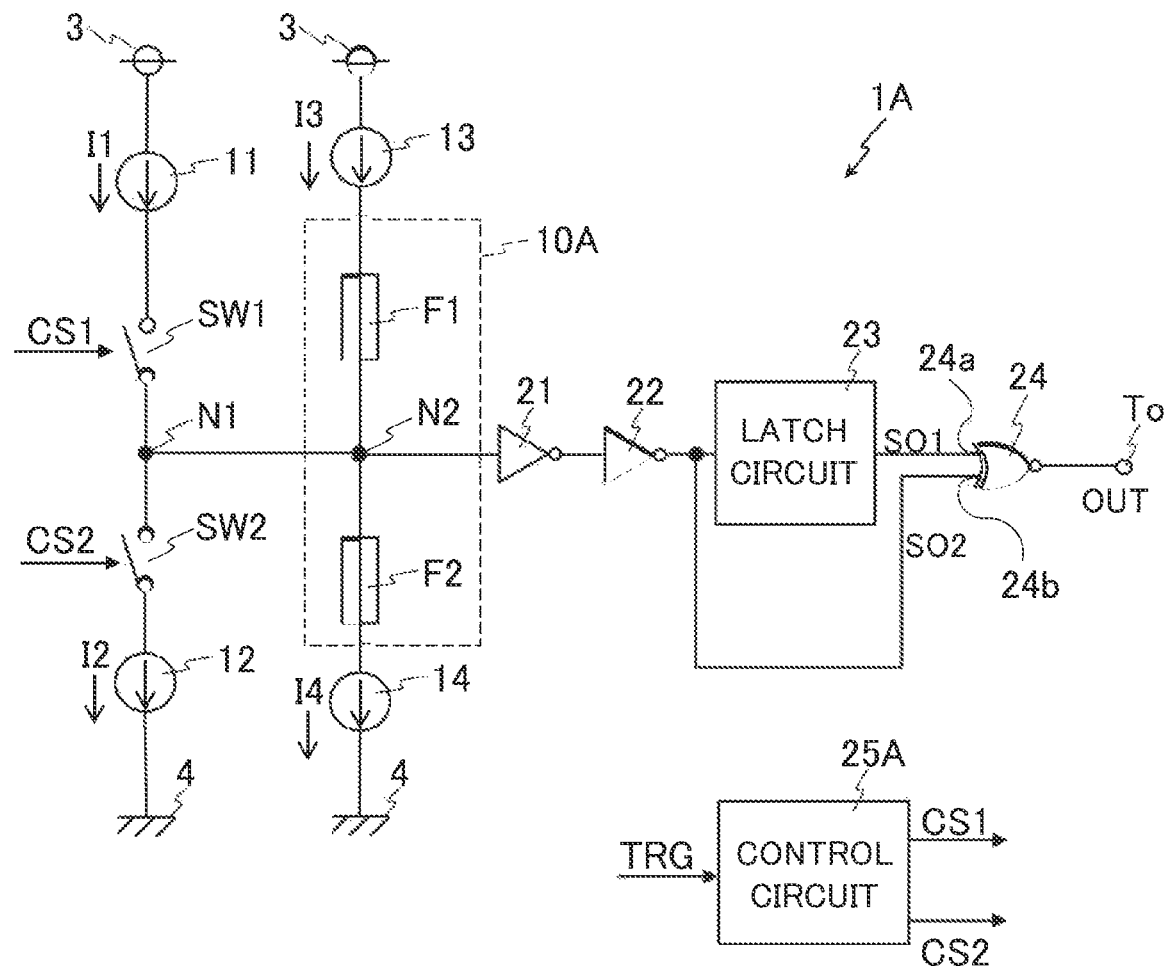
FIG. 1 is a circuit diagram of a semiconductor device according to a first embodiment.

FIG. 1 is a circuit diagram of a semiconductor device 1A as an example of a semiconductor device according to a first embodiment. According to FIG. 1, the semiconductor device 1A includes a trimming circuit 10A, current sources 11 to 14, a switch SW1, a switch SW2, a latch circuit 23, an EXNOR circuit 24, and a control circuit 25A.

The trimming circuit 10A includes a fuse F1 and a fuse F2 connected in series. Each of the fuse F1 as a first fuse and the fuse F2 as a second fuse contains a first end and a second end, respectively. The fuse F1 and the fuse F2 are connected in series by connecting the second end of the fuse F1 and the first end of the fuse F2. A connection point between the fuse F1 and the fuse F2 forms a node N2.

Two current paths are formed between a first power supply terminal 3 from which supplies a first power source voltage and a second power supply terminal 4 from which supplies a second power source voltage. A current source 11 and a current source 12 are connected in series in a first current path. Further, the switch SW1 and the switch SW2 are connected in series between the current source 11 and the current source 12. A connection point between the switch SW1 and the switch SW2 forms a node N1. The current sources 11 and 12 and the switches SW1 and SW2 are configured as a current source circuit in the semiconductor device 1A.

The current source 11 as a first current source includes a first end connected to the first power supply terminal 3 and a second end. The current source 12 as a second current source includes a first end and a second end connected to the second power supply terminal 4.

The switch SW1 as a first switch includes a first port connected to the second port of the current source 11, and a second port connected to the second end of the fuse F1 and the first end of the fuse F2. The switch SW1 further includes a control port as an input port of a control signal. A control signal CS1 is supplied to this control port.

The switch SW2 as a second switch includes a first port connected to the second port of the switch SW1, the second end of the fuse F1, and the first end of the fuse F2, and a second port connected to the first port of the current source 12. The switch SW2 further includes a control port as an input port of a control signal. A control signal CS2 is supplied to this control port.

The current source 13 and the current source 14 are connected in series in a second current path. The trimming circuit 10A is connected between the current source 13 and the current source 14.

The current source 13 as a third current source includes a first port connected to the first power supply terminal 3 and a second port connected to the first end of the fuse F1. The current source 14 as a fourth current source includes a first port connected to the second end of the fuse F2 and a second port connected to the second power supply terminal 4.

Note that the node N1 and the node N2 are connected. In other words, the node N1 and the node N2 form an identical node (hereinafter, this node is called the node N1). The node N1 is further connected to the latch circuit 23 through two inverters 21, 22 connected in series as a buffer. The latch circuit 23 and the EXNOR circuit 24 corresponds to a determination circuit.

The latch circuit 23, serving as a part of the determination circuit, includes an input terminal connected through the inverters 21, 22 to the second port of the switch SW1, the first port of the switch SW2, the second end of the fuse F1, and the first end of the fuse F2, and an output terminal.

The EXNOR circuit 24, serving as a logic circuit or another part of the determination circuit, includes a first input terminal 24a connected to the output terminal of the latch circuit 23, a second input terminal 24b connected to the input terminal of the latch circuit 23, and an output terminal. This output terminal is connected to an output terminal To of the semiconductor device 1A.

The control circuit 25A includes an input terminal to which a trigger signal TRG is supplied, a first output terminal from which the control signal CS1 is provided, and a second output terminal from which the control signal CS2 is provided. The first output terminal of the control circuit 25A is connected to the control port of the switch SW1. The second output terminal of the control circuit 25A is connected to the control port of the switch SW2.

The operation of the semiconductor device 1A will be described next.

The current sources 11 to 14 supply currents I1 to I4, respectively. The control signal CS1 as a first control signal is supplied to the switch SW1. The control signal CS2 as a second control signal is supplied to the switch SW2. The control signals CS1 and CS2 are supplied, for example, from the control circuit 25A. In response to reception of the trigger signal TRG, the control circuit 25A generates the control signal CS1 and the control signal CS2, and outputs the control signal CS1 and the control signal CS2 to the switch SW1 and the switch SW2, respectively.

The control signal CS1 makes a transition between a low level as a first signal level (hereinafter, referred to as "L level") and a high level as a second signal level (hereinafter, referred to as "H level"). The opening/closing of the switch SW1 is controlled based on the control signal CS1. The opening/closing of the switch SW2 is controlled based on the control signal CS2. The control signal CS2 and the opening/closing of the switch SW2 are the same as the control signal CS1 and the opening/closing of the switch SW1.

The latch circuit 23 latches the potential at the node N1 in a first open/closed state in which the switch SW1 and the switch SW2 are in a closed state and an open state, respectively. After that, the switch SW1 and the switch SW2 make a transition of the open/closed state from the first open/closed state to a second open/closed state.

After the switch SW1 and the switch SW2 make the transition to the second open/closed state, a signal SO1 is supplied from the latch circuit 23 to the first input terminal 24a, and a signal SO2 supplied to the latch circuit 23 is supplied to the second input terminal 24b. The signal SO1 indicates the potential at the node N1 in such a state that the switch SW1 is closed and the switch SW2 is open. The signal SO2 indicates the potential at the node N1 in such a state that the switch SW1 is open and the switch SW2 is closed.

The EXNOR circuit 24 determines whether the signal levels of the signals SO1 and SO2 match (or mismatch) each other during a period in which the signal level of the control signal CS2 is the H level. In a case where both the signals SO1 and SO2 are in the L level or the H level, that is, where both the signals SO1 and SO2 match each other, the EXNOR circuit 24 outputs, to the output terminal To, an H-level signal OUT indicative of the result of determining the match.

Meanwhile, in a case where the signal SO1 and the signal SO2 are in the L level and the H level, or in the H level and the L level, that is, where the signal levels of both the signals SO1 and SO2 mismatch each other, the EXNOR circuit 24 outputs, to the output terminal To, an L-level signal OUT indicative of the result of determining the mismatch.

Next, a method of applying the semiconductor device 1A to detect a state where the fuse F1, F2 is short-circuited (not cut) and a state where the fuse F1, F2 is cut (hereinafter called a "state detection method") will be described.

First State Detection Method

In a first state detection method, the currents I1 to I4 are set to satisfy conditions of expressions (1) to (3) below. Specifically, the currents I1 to I4 are so set that the current I1 and the current I2 are equal to each other (see expression, i.e., Equation (1) below), the current I3 and the current I4 are equal to each other (see expression, i.e., Equation (2) below), and the current I3 (=I4) is sufficiently larger than the current I2 (=I1) (see expression, i.e., Inequality (3) below). The fact that the current I3, I4 is sufficiently larger than the current I1, I2 means that the current I3, I4 is larger by one digit or more than the current I1, I2.

$$I1=I2 \tag{1}$$

$$I3=I4 \tag{2}$$

$$I2<<I3 \tag{3}$$

The signal levels of the control signal CS1 and the control signal CS2 make transitions in the order of L level→H level→L level. Further, the signal level of the control signal CS2 is set to make transitions in the order of L level→H level→L level after the transitions of the signal level of the control signal CS1 in the order of L level→H level→L level. According to the above-mentioned settings of the control signals CS1 and CS2, the second open/closed state is so set that the switch SW1 is open and the switch SW2 is closed.

The potential at the node N1 in the first open/closed state, that is, the signal SO1, will be described.

In the first open/closed state, in the case where the fuses F1 and F2 are both short-circuited and in the case where the fuses F1 and F2 are both cut, the potential at the node N1 becomes the potential of the first power supply terminal 3, that is, the H level. In the case where the fuse F1 is short-circuited and the fuse F2 is cut, the potential at the node N1 becomes the H level from the above-mentioned relation of Inequality (3) mentioned above. Further, in the case where the fuse F1 is cut and the fuse F2 is short-circuited, the potential at the node N1 becomes the potential of the second power supply terminal 4, that is, the L level, from the relation of Inequality (3) mentioned above.

For example, the latch circuit 23 latches the potential at the node N1 in the first open/closed state (where the switch SW1 is closed and the switch SW2 is open) at the timing where the signal level of the control signal CS1 makes a transition from the H level to the L level, that is, where the switch SW1 is turned off.

The potential at the node N1 in the second open/closed state, that is, the signal SO2 and the signal OUT, will then be described.

In the second open/closed state, in the case where the fuses F1 and F2 are both short-circuited and in the case where the fuses F1 and F2 are both cut, the potential at the node N1 becomes the potential of the second power supply terminal 4, that is, the L level. In the case where the fuse F1 is short-circuited and the fuse F2 is cut, the potential at the node N1 becomes the potential of the first power supply terminal 3, that is, the H level, from the above-mentioned relation of Inequality (3). Further, in the case where the fuse F1 is cut and the fuse F2 is short-circuited, the potential at the node N1 becomes the L level from the relation of Inequality (3) mentioned above.

In the case where the signals SO1 and SO2 are both in the L level or the H level, the signal level of the signal OUT becomes the H level. On the other hand, in the case where the signal SO1 and the signal SO2 are in the L level and the H level or the H level and the L level, respectively, the signal level of the signal OUT becomes the L level.

According to the first state detection method, in a correct cut state where the fuses F1 and F2 are cut in an expected state, the signal level of the signal OUT becomes the H level. Here, the correct cut state is such a state that either one of the fuses F1 and F2 is cut and the other is short-circuited. On the other hand, in an abnormal cut state where the fuses F1 and F2 are cut in an unexpected state, the signal level of the signal OUT becomes the L level. Here, the abnormal cut state is such a state that the fuses F1 and F2 are both cut or short-circuited.

According to the first state detection method, it can be detected that the fuses F1 and F2 are in the abnormal cut state in the case where the signal level of the signal OUT is the L level.

Further, there is no need to make a high current flow through the fuses F1 and F2 in order to detect whether the fuse F1, F2 is cut or not (or short-circuited), that is, to detect the cut state of the fuse F1, F2. According to the first state detection method, the occurrence of damage to the fuses F1 and F2 can be prevented.

Further, according to the first state detection method, the abnormal cut state of the fuses F1 and F2 can be detected even if the semiconductor device 1A is in a packaged state.

Second State Detection Method

Since a second state detection method is not substantially different from the first state detection method except for the settings of the current I1 and the current I2 and the setting of the second open/closed state, the second state detection method will be described by simplifying or omitting the description that overlaps with the description of the first state detection method.

In the second state detection method, the currents I1 to I4 are set to satisfy the above-mentioned conditions of expressions (2) and (3), and a condition of expression (4) below. Specifically, the currents I1 to I4 are so set that the current I1 is smaller than the current I2 (see expression, i.e., Inequality (4) below), the current I3 and the current I4 are equal to each other (see Equation (2) above), and the current I3 (=I4) is sufficiently larger than the current I2 (>I1) (see Inequality (3) above).

$$I1<I2 \quad (4)$$

The signal levels of the control signal CS1 and the control signal CS2 make transitions in the order of L level→H level→L level. The signal level of the control signal CS2 makes a transition from the L level to the H level during a period in which the signal level of the control signal CS1 is the H level. In the first open/closed state, the settings of the control signals CS1 and CS2 mentioned above cause the control signal CS1 and the control signal CS2 to become the H level and the L level, respectively. Further, in the second open/closed state, the control signal CS1 and the control signal CS2 both become the H level.

In the second state detection method, the first open/closed state is so set that the switch SW1 is closed and the switch SW2 is open. The second open/closed state is so set that the switches SW1 and SW2 are both closed. The latch circuit 23 latches the potential at the node N1 after the transition to the first open/closed state (the state where the switch SW1 is closed and the switch SW2 is open) and before the transition to the second open/closed state (the state where the switches SW1 and SW2 are both closed). In other words, the potential at the node N1 in the first open/closed state is latched.

The transitions of the signal levels of the signal SO1, the signal SO2, and the signal OUT in the second state detection method are the same as the transitions of the signal levels of the signal SO1, the signal SO2, and the signal OUT in the first state detection method. This means that it can be detected that the fuses F1 and F2 are in the abnormal cut state as long as the L-level signal OUT is provided from the EXNOR circuit 24. According to the second state detection method, the same effect as the first state detection method can be obtained.

Third State Detection Method

Since a third state detection method is not substantially different from the first state detection method except for the settings of the current I3 and the current I4, and the signal level of the signal SO1 in the case where the fuses F1 and F2 are both short-circuited, the third state detection method will be described by simplifying or omitting the description that overlaps with the description of the first state detection method.

In the third state detection method, the currents I1 to I4 are set to satisfy the above-mentioned conditions of expressions (1) and (3), and a condition of expression (5) below. Specifically, the currents I1 to I4 are so set that the current I1 is equal to the current I2 (see Equation (1) above), the current I3 is smaller than the current I4 (see expression, i.e., Inequality (5) below), and the current I3 (<I4) is sufficiently larger than the current I2 (=I1) (see Inequality (3) above).

$$I3<I4 \quad (5)$$

In the first open/closed state, in the case where the fuses F1 and F2 are both short-circuited, the potential at the node N1 becomes the potential of the second power supply terminal 4 from the relation of Inequalities (3) and (5) mentioned above. In other words, the signal level of the signal SO1 becomes the L level. Note that in the case where the fuses F1 and F2 are both cut, in the case where the fuse F1 is short-circuited and the fuse F2 is cut, and in the case where the fuse F1 is cut and the fuse F2 is short-circuited, the signal level of the signal SO1 is the same as that in the first state detection method.

Further, in the second open/closed state, in the case where the fuses F1 and F2 are both short-circuited, in the case where the fuses F1 and F2 are both cut, in the case where the fuse F1 is short-circuited and the fuse F2 is cut, and in the case where the fuse F1 is cut and the fuse F2 is short-circuited, the signal level of the signal SO2 is the same as that in the first state detection method.

In the case where the fuses F1 and F2 are both short-circuited, the signal level of the signal OUT becomes the H level that indicates a match. Further, in the case where the fuses F1 and F2 are both cut, in the case where the fuse F1 is short-circuited and the fuse F2 is cut, and in the case where the fuse F1 is cut and the fuse F2 is short-circuited, the signal level of the signal OUT is the same as that in the first state detection method.

Further, in the third state detection method, current consumption inside the semiconductor device 1A will not become zero from the conditions of expressions (1), (3), and (5) mentioned above if the fuses F1 and F2 are both short-circuited. In the above-described first and second state detection methods, current consumption inside the semiconductor device 1A does not occur in any case. In other words, current consumption is zero. In the third state detection method, current consumption inside the semiconductor device 1A is zero in three cases except in the case where the fuses F1 and F2 are both short-circuited.

In the third state detection method, the signal level of the signal OUT becomes the H level even in the case where the fuses F1 and F2 are both short-circuited in addition to the case where the fuses F1 and F2 are in the correct cut state. It seems to be indistinguishable between the correct cut state of the fuses F1, F2, and the abnormal cut state of the fuses F1, F2 in which the fuses F1 and F2 are both short-circuited. However, in the third state detection method, there is a clear difference in terms of the presence or absence of current between current consumption inside the semiconductor device 1A in the correct cut state of the fuses F1, F2, and current consumption inside the semiconductor device 1A in the case where the fuses F1 and F2 are both short-circuited.

According to the third state detection method, the same effect as the first state detection method and the second state detection method can be obtained. Further, according to the third state detection method, the abnormal cut state of the fuses F1, F2 can be determined in more detail from two pieces of information about the signal level of the signal OUT and current consumption inside the semiconductor device 1A. Specifically, in the case of the abnormal cut state of the fuses F1, F2, it can be determined whether the fuses F1 and F2 are both short-circuited or the fuses F1 and F2 are both cut.

Note that the third state detection method is described above in the case where the current Ti is equal to the current I2, that is, in the case where Equation (1) mentioned above is satisfied, but the current I1 is not necessarily be equal to the current I2. The current I1 may be smaller than the current I2. The signals SO1, SO2, OUT, and the presence or absence of current consumption in this case are the same as the signals SO1, SO2, OUT, and the presence or absence of current consumption in the case where the current I1 is equal to the current I2. In other words, the current I1 is merely equal to or smaller than the current I2 (I1≤I2) in the third state detection method.

According to the embodiment, the abnormal cut state in which the fuses F1 and F2 are both short-circuited or the fuses F1 and F2 are both cut can be detected. Further, according to the embodiment, it can be detected whether the fuses F1 and F2 are in the correct cut state or not (or in the abnormal cut state) even if the semiconductor device 1A is in the packaged state. Further, it can be detected that the fuses F1 and F2 are in the correct cut state without damaging the fuses F1 and F2.

Further, if the third state detection method is applied, it can be detected which state the abnormal cut state of the fuses F1 and F2 is, that is, which of the state where the fuses F1 and F2 are both short-circuited and the state where the fuses F1 and F2 are both cut.

Second Embodiment

Figure 2:
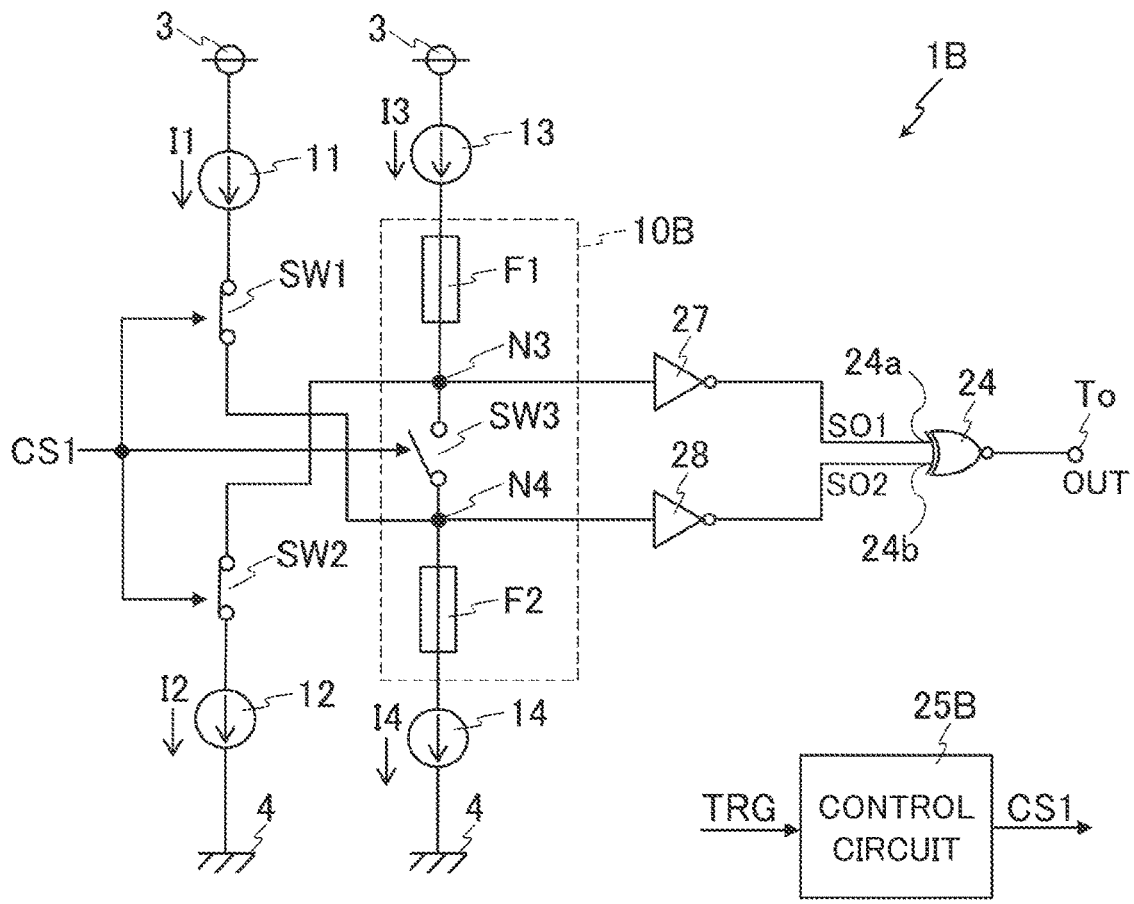
FIG. 2 is a circuit diagram of a semiconductor device according to a second embodiment.

FIG. 2 is a circuit diagram of a semiconductor device 1B as an example of a semiconductor device according to a second embodiment. The semiconductor device 1B illustrated in FIG. 2 is in a state of detecting the short-circuited or cut state of the fuse F1 or F2 (hereinafter, referred to as a "state detection mode").

The semiconductor device 1B is different from the semiconductor device 1A in that a trimming circuit 10B and a control circuit 25B are included instead of the trimming circuit 10A and the control circuit 25A, different in the connection destinations of the second port of the switch SW1 and the first port of the switch SW2, and different in that the latch circuit 23 is omitted, but the other points are the same. In the embodiment, the above-described different points will be mainly described by omitting the description overlapping with that of the semiconductor device 1A.

According to FIG. 2, the semiconductor device 1B includes the trimming circuit 10B, the current sources 11 to 14, the switch SW1, the switch SW2, the EXNOR circuit 24, and the control circuit 25B. The current source circuit of the semiconductor device 1B includes the same elements connected in the first path as that of the semiconductor device 1A, but objects to which the second port of the switch SW1 and the first port of the switch SW2 are connected are different from those of the semiconductor device 1A.

The trimming circuit 10B has a fuse F1 and a fuse F2 connected in series, and a switch SW3 as a first switch. The switch SW3 includes a first port connected to a second end of the fuse F1, a second port connected to a first end of the fuse F2, and a control port to which a control signal CS1 as a control signal is supplied.

In addition to the second end of the fuse F1, a first port of the switch SW2 as a third switch is further connected to the first port of the switch SW3. A connection point among the first port of the switch SW3, the second end of the fuse F1, and the first port of the switch SW2 forms a node N3. The node N3 is further connected to a first input terminal 24a through an inverter 27.

In addition to the first end of the fuse F2, the second port of the switch SW3 is further connected to a second port of the switch SW1 as a second switch. A connection point among the second port of the switch SW3, the first end of the fuse F2, and the second port of the switch SW1 forms a node N4. The node N4 is connected to a second input terminal 24b through an inverter 28.

The control circuit 25B includes an input terminal to which a trigger signal TRG is supplied, and an output terminal from which the control signal CS1 as the control signal is provided. The output terminal of the control circuit 25B is connected to the control ports of the switches SW1, SW2, and SW3, respectively.

The switch SW3 is a switch that is open and closed in an open/closed state opposite to that of the switches SW1 and SW2. Specifically, the switch SW3 is in a closed state in a case where the switches SW1 and SW2 are in an open state. On the other hand, the switch SW3 is in the open state in a case where the switches SW1 and SW2 are in the closed state.

The operation of the semiconductor device 1B will be described next.

The current sources 11 to 14 supply currents I1 to I4, respectively. The control signal CS1 is supplied to the control ports of the switches SW1, SW2, and SW3, respectively.

The control signal CS1 is, for example, supplied from the control circuit 25B. The control circuit 25B generates the control signal CS1 in response to reception of the trigger signal TRG, and outputs the control signal CS1 to the control ports of the switches SW1, SW2, and SW3, respectively. The switches SW1, SW2, and SW3 are controlled to the open state or the closed state based on the control signal CS1.

The semiconductor device 1B can switch between a normal mode, in which the short-circuited and cut states of the fuses F1 and F2 are not detected, and the state detection mode. The normal mode and the state detection mode are switched in response to switching of the signal level of the control signal CS1.

For example, in a case where the signal level of the control signal CS1 is the L level, the mode of the semiconductor device 1B becomes the normal mode, while in a case where the signal level of the control signal CS1 is the H level, the mode of the semiconductor device 1B becomes the state detection mode. In the normal mode, the switches SW1, SW2, and SW3 are in the open state, the open state, and the closed state, respectively. In the state detection mode, the switches SW1, SW2, and SW3 are in the closed state, the closed state, and the open state, respectively.

Upon transition of the semiconductor device 1B from the normal mode to the state detection mode, the switches SW1, SW2, and SW3 make transitions to the closed state, the closed state, and the open state, respectively. In the state detection mode, a signal SO1 is supplied to the first input terminal 24a and a signal SO2 is supplied to the second input terminal 24b. The signal SO1 is a signal obtained by inverting the potential of the node N3 through the inverter 27. The signal SO2 is a signal obtained by inverting the potential of the node N4 through the inverter 28.

The EXNOR circuit 24 determines whether the signal levels of the signals SO1 and SO2 match (or mismatch) each other during a period in which the signal level of the control signal CS1 is the H level, that is, in the state detection mode.

Next, a state detection method (hereinafter called a "fourth state detection method") of the fuses F1, F2 by the application of the semiconductor device 1B will be described next.

In the fourth state detection method, the currents I3 and I4 are set sufficiently larger than the currents I1 and I2. Note that the magnitude relation between the current I1 and the current I2, and the magnitude relation between the current I3 and the current I4 do not matter as long as the currents I3 and I4 are sufficiently larger than the currents I1 and I2. In other words, the current I1 may be equal to the current I2, or may be different from the current I2. The current I3 may be equal to the current I4, or may be different from the current I4.

Note, however, that the current I4 is set to satisfy a condition of being sufficiently larger than the current I1 (I1<<I4) even in the cases of I2<I1 and I4<I3 from the condition that the currents I3 and I4 are sufficiently larger than the currents I1 and I2.

In the state detection mode, the potential at the node N3 becomes the H level from I3>>I2 in the case where the fuse F1 is short-circuited. Further, in the case where the fuse F1 is cut, the potential at the node N3 becomes the L level due to the current I2. In response, the signal level of the signal SO1 becomes the L level in the case where the fuse F1 is short-circuited or the H level in the case where the fuse F1 is cut.

The potential at the node N4 becomes the L level from I4>>I1 in the case where the fuse F2 is short-circuited. Further, in the case where the fuse F2 is cut, the potential at the node N4 becomes the H level due to the current IL In response, the signal level of the signal SO2 becomes the H level in the case where the fuse F2 is short-circuited or the L level in the case where the fuse F2 is cut.

The signal level of the signal OUT, and the short-circuited and cut states of the fuses F1 and F2 corresponding to the signal level of the signal OUT are the same as those in the first state detection method. In other words, in the fourth state detection method, it can be detected that the fuses F1 and F2 are in the correct cut state in the case where the signal level of the signal OUT is the H level, and that the fuses F1 and F2 are in the abnormal cut state in the case where the signal level of the signal OUT is the L level.

According to the embodiment, the abnormal cut state of the fuses F1 and F2 can be detected. Further, it can be detected whether the fuses F1 and F2 are in the correct cut state or not (or in the abnormal cut state) even if the semiconductor device 1B is in the packaged state. Further, it can be detected whether the fuses F1 and F2 are in the correct cut state or not without damaging the fuses F1 and F2.

Note that the present invention is not limited to the above-described embodiments. The present invention can be carried out in various forms other than the examples described above at the implementation stage, and various omissions, replacements, and changes can be made without departing from the scope of the invention.

For example, in the above-described embodiments, the example in which the semiconductor device 1A, 1B includes the control circuit 25A, 25B is described, but the semiconductor device 1A, 1B is not limited to the above-described example. The semiconductor device 1A with the control circuit 25A omitted therefrom may be so constructed that the control signals CS1 and CS2 are supplied respectively to the control ports of the switches SW1 and SW2 from a control circuit provided outside of the semiconductor device 1A. That is, the semiconductor device 1A may not include the control circuit 25A. Further, the semiconductor device 1A may be constructed by applying, as the switches SW1 and SW2, switches that can be opened and closed manually.

The semiconductor device 1A described above is the example in which the inverters 21 and 22 are connected between the node N1 and the input terminal of the latch circuit 23, but the inverters 21 and 22 may not be connected. That is, the semiconductor device 1A described above may not include the inverters 21 and 22.

The semiconductor device 1B may not include the control circuit 25B as is the case with the semiconductor device 1A. The semiconductor device 1B with the control circuit 25B omitted therefrom may be so constructed that the control signal CS1 is supplied to the control ports of the switches SW1, SW2, and SW3, respectively, from a control circuit provided outside of the semiconductor device 1B. Further, the semiconductor device 1B may be constructed by applying, as the switches SW1 to SW3, switches that can be opened and closed manually.

In the above-described embodiments, the example in which the semiconductor device 1A, 1B includes the EXNOR circuit 24 as another part of the determination circuit or the logic circuit is described, but the semiconductor device 1A, 1B is not limited to the above-described example. The determination circuit may also be constructed to output a signal of the H level in a case where the signal supplied to the latch circuit 23 mismatches a signal provided from the latch circuit 23. In other words, the semiconductor device 1A, 1B may include an EXOR circuit instead of the EXNOR circuit 24.

Further, the structure of the determination circuit does not matter as long as it can determine a match or mismatch between the signal supplied to the latch circuit 23 and the signal provided from the latch circuit 23. In other words, the determination circuit and the logic circuit do not necessarily include the EXNOR circuit 24 or the EXOR circuit. For example, the logic circuit may be configured by a circuit equivalent to the EXNOR circuit 24 or the EXOR circuit, the circuit having different components of the EXNOR circuit 24 or the EXOR circuit. The circuit equivalent to the EXNOR circuit 24 or the EXOR circuit may be constructed by connecting two or more logic elements such as AND elements or elements, and an inverter, instead of the EXNOR circuit 24 or the EXOR circuit.

Figure 3:
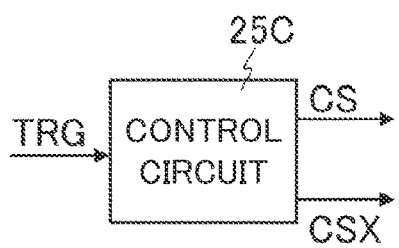
FIG. 3 is a block diagram illustrating another example of a control circuit in the semiconductor device according to the second embodiment.

Note that the semiconductor device 1B is not limited to the example illustrated in FIG. 2 as long as the switch SW1 and the switch SW2 are opened/closed inconsistently (exclusively) with the switch SW3. For example, the semiconductor device 1B may also include the switches SW1 to SW3 and a control circuit 25C illustrated in FIG. 3 in such a manner that the opening/closing of the switch SW3 is controlled based on a control signal CS, and the opening/closing of the switch SW1 and the switch SW2 is controlled based on a control signal CSX.

In the semiconductor device 1B, the control signal CSX as a second control signal is an inverted signal of the control signal CS as the first control signal. In other words, the control signal CSX is a control signal to make a transition of the signal level inconsistently (exclusively) with the signal level of the control signal CS. Further, the switches SW1 to SW3 are such switches that become the same open/closed state as the open/closed state based on the control signal supplied to each of the control ports, respectively. The switch SW3 as a first switch includes a control port to which the control signal CS is supplied. The switch SW1 as a second switch and the switch SW2 as a third switch include control ports to which the control signal CSX is supplied, respectively.

Further, as another structure, the semiconductor device 1B may have a structure to include switches SW1 to SW3 that become the same open/closed state as the open/closed state based on the control signal supplied to each of the control ports, respectively, and the control circuit 25B, and further include an inverter connected between the control port of the switch SW3 and the output terminal of the control circuit 25B.

These embodiments and modifications thereof are included in the scope and gist of the invention, and further included in a scope of inventions as set forth in the claims and an equivalent scope thereof.

What is claimed is:

1. A semiconductor device comprising:
    a trimming circuit including a first fuse and a second fuse connected in series;
    a current source circuit which is connected between a first power supply terminal supplying a first power source and a second power supply terminal supplying a second power source, and which is configured to supply current to the trimming circuit;
    a determination circuit configured to determine whether a connection state or disconnect state of the first fuse and the second fuse are abnormal or not based upon signals derived from an output signal of the trimming circuit;
    a first current source containing a first end to be connected to the first power supply terminal, and a second end connected to the first fuse; and
    a second current source containing a first end connected to the second fuse, and a second end to be connected to a second power supply terminal,
    wherein the first fuse includes a first end connected to the second end of the first current source, and a second end,
    wherein the second fuse includes a first end connected to the second end of the first fuse, and a second end connected to the first end of the second current source,
    wherein the current source circuit includes:
        a third current source containing a first end connected to the first power supply terminal and a second end;
        a fourth current source containing a first end and a second end connected to the second power supply terminal;
        a first switch containing a first port connected to the second end of the third current source and a second port connected to the second end of the first fuse and the first end of the second fuse; and
        a second switch containing a first port connected to the second port of the first switch, the second end of the first fuse, and the first end of the second fuse, and a second port connected to the first end of the fourth current source, and
    wherein the determination circuit includes:
        a latch circuit containing an input terminal connected to the second port of the first switch, the first port of the second switch, the second end of the first fuse, and the first end of the second fuse, and an output terminal; and
        a logic circuit containing a first input terminal connected to the output terminal of the latch circuit, a second input terminal connected to the input terminal of the latch circuit, and an output terminal from which a signal indicative of a result of determining a match or mismatch between a signal supplied to the first input terminal and a signal supplied to the second input terminal is provided.

2. The semiconductor device according to claim 1, further comprising a control circuit configured to generate a first control signal to control opening/closing of the first switch and a second control signal to control opening/closing of the second switch,
    wherein the first switch includes a control port to which the first control signal is supplied, and
    the second switch includes a control port to which the second control signal is supplied.

3. A semiconductor device comprising:
    a trimming circuit including a first fuse and a second fuse connected in series;
    a current source circuit which is connected between a first power supply terminal supplying a first power source and a second power supply terminal supplying a second power source, and which is configured to supply current to the trimming circuit;

a determination circuit configured to determine whether a connection state or disconnect state of the first fuse and the second fuse are abnormal or not based upon signals derived from an output signal of the trimming circuit;

a first current source containing a first end to be connected to the first power supply terminal, and a second end connected to the first fuse; and a second current source containing a first end connected to the second fuse, and a second end to be connected to a second power supply terminal, wherein the first fuse includes a first end connected to the second end of the first current source, and a second end, wherein the trimming circuit further includes a first switch between the first fuse and the second fuse, the first switch containing a first port connected to the second end of the first fuse, and a second port, wherein the second fuse includes a first end connected to the second port of the first switch, and a second end connected to the first end of the second current source, wherein the current source circuit includes:
  a third current source containing a first end connected to the first power supply terminal and a second end;
  a fourth current source containing a first end and a second end connected to a second power supply terminal;
  a second switch containing a first port connected to the second end of the third current source and a second port connected to the first end of the second fuse and the second port of the first switch; and
  a third switch containing a first port connected to the second end of the first fuse and the first port of the first switch and a second port connected to the first end of the fourth current source, and wherein the determination circuit is configured by a logic circuit including a first input terminal connected to the first port of the first switch, the first port of the third switch, and the second end of the first fuse, a second input terminal connected to the second port of the first switch, the second port of the second switch, and the first end of the second fuse, and an output terminal from which a signal indicative of a result of determining a match or mismatch between a signal supplied to the first input terminal and a signal supplied to the second input terminal is provided.

4. The semiconductor device according to claim 3, further comprising a control circuit configured to generate a control signal having one signal level selected from a first signal level and a second signal level, wherein the first switch contains a control terminal to which the control signal is supplied, and is configured to be closed in response to reception of the control signal at the first signal level and opened in response to reception of the control signal at the second signal level, wherein the second switch includes a control terminal to which the control signal is supplied, and is configured to be opened in response to reception of the control signal at the first signal level and closed in response to reception of the control signal at the second signal level, and wherein the third switch includes a control terminal to which the control signal is supplied, and is configured to be opened in response to reception of the control signal at the first signal level and closed in response to reception of the control signal at the second signal level.

5. The semiconductor device according to claim 3, further comprising a control circuit configured to generate a first control signal having one signal level selected from a first signal level and a second signal level, and a second control signal having a signal level inconsistent with the selected signal level of the first control signal, wherein the first switch includes a control port to which the first control signal is supplied, and the second switch and the third switch each include a control port to which the second control signal is supplied.

6. A semiconductor device comprising:
a trimming circuit including a first fuse and a second fuse connected in series;

a current source circuit which is connected between a first power supply terminal supplying a first power source and a second power supply terminal supplying a second power source, and which is configured to supply current to the trimming circuit;

a determination circuit configured to determine whether a connection state or disconnect state of the first fuse and the second fuse are abnormal or not based upon signals derived from an output signal of the trimming circuit, wherein the first fuse includes a first end and a second end, wherein the second fuse includes a first end connected to the second end of the first fuse, and a second end, wherein the current source circuit includes:
  a first current source containing a first end to be connected to the first power supply terminal and a second end connected to the first fuse;
  a second current source containing a first end connected to the second fuse and a second end to be connected to a second power supply terminal;
  a third current source containing a first end connected to the first power supply terminal and a second end;
  a fourth current source containing a first end and a second end connected to the second power supply terminal;
  a first switch containing a first port connected to the second end of the third current source and a second port connected to the second end of the first fuse and the first end of the second fuse; and
  a second switch containing a first port connected to the second port of the first switch, the second end of the first fuse, and the first end of the second fuse, and a second port connected to the first end of the fourth current source.

* * * * *